(12) United States Patent
Avss et al.

(10) Patent No.: US 7,577,011 B2
(45) Date of Patent: Aug. 18, 2009

(54) OPTIMIZATION OF ROM STRUCTURE BY SPLITTING

(75) Inventors: Prasad Avss, Bangalore (IN); Ravi Pathakota, Proddatur (IN)

(73) Assignee: Agere Systems Inc., Allentown, PA (US)

( * ) Notice: Subject to any disclaimer, the term of this patent is extended or adjusted under 35 U.S.C. 154(b) by 405 days.

(21) Appl. No.: 11/623,218

(22) Filed: Jan. 15, 2007

(65) Prior Publication Data

US 2008/0104566 A1 May 1, 2008

Related U.S. Application Data

(63) Continuation-in-part of application No. 11/580,786, filed on Oct. 13, 2006.

(51) Int. Cl.
G11C 17/00 (2006.01)
G11C 8/00 (2006.01)
G06F 12/00 (2006.01)

(52) U.S. Cl. .............. 365/94; 365/230.01; 365/189.011; 711/170; 711/171; 711/102

(58) Field of Classification Search ................... 365/94, 365/96, 114, 189.011, 230.01, 238.05; 711/102, 711/170–171, 212
See application file for complete search history.

(56) References Cited

U.S. PATENT DOCUMENTS

| 5,504,875 | A | * | 4/1996 | Mills et al. .................... 711/171 |
| 5,563,844 | A | * | 10/1996 | Takata et al. ............. 365/233.5 |
| 6,084,793 | A | * | 7/2000 | Komatsu ...................... 365/94 |
| 7,106,651 | B2 | * | 9/2006 | Nagai et al. ............ 365/230.06 |
| 7,246,198 | B2 | * | 7/2007 | Nataraj et al. ................ 711/108 |
| 2005/0105380 | A1 | * | 5/2005 | Takahashi et al. ............ 365/233 |

* cited by examiner

*Primary Examiner*—Stacy A Whitmore

(57) ABSTRACT

A method for designing a read-only memory (ROM), and related device, includes partitioning a dataset into two or more sub-datasets that each have the same address space, but are of a smaller bit-width than the original dataset. The sub-datasets are row collapsed, and then respective memory cells for the sub-datasets are provided. The output of the memory cells provides the output of the ROM. Each memory cell includes a decoder that maps addresses to word lines based on mapping information obtained during row collapsing, and a logic array driven by the decoder that encodes the data words of the sub-dataset.

7 Claims, 4 Drawing Sheets

Fig. 1, Prior art

OPTIMIZATION OF ROM STRUCTURE BY SPLITTING

CROSS-REFERENCE TO RELATED APPLICATIONS

This application is a continuation-in-part of Application Ser. No. 11/580,786, filed Oct. 13, 2006, which is included herein by reference in its entirety.

FIELD OF THE INVENTION

The present invention relates generally to reducing the size requirements of a read-only memory (ROM), and more particularly, to restructuring the architecture of the ROM based upon the data to be stored within the ROM, which may be applicable to SoC and ASIC devices.

BACKGROUND OF THE INVENTION

Steady advances in miniaturization techniques for integrated circuits have resulted in circuit devices, particularly transistors, of ever-diminishing sizes. Generally speaking, each generation of an integrated circuit utilizes transistors that occupy smaller footprints on the semiconductor substrate than those of the previous generation. However, consumer desires, with resultant design demands, seem to grow even faster than integrated circuit devices have been shrinking. As a result, rather than being in surplus, real estate on the circuit substrate remains at a premium. Every unit of area on a substrate must be maximally utilized to squeeze as much performance as possible into the limited space of the circuit die. If a way can be found to reduce the size of a circuit in one portion of a chip, the area thereby freed up can be used to support additional circuitry to pack even more logic functionality into the same die. The miniaturization race therefore involves not only reducing the footprint of individual devices, such as transistors, on the die, but also finding ways to use fewer such devices to achieve the same functionality.

Many digital designs employ read-only memory (ROM), which is built directly onto the same die with the rest of the circuit. This on-chip ROM provides necessary data for the circuit, such as microcode instructions, object code, operating parameters and the like. Generally, a ROM circuit has Q address lines as input for accessing $2^Q$ data words respectively stored within the ROM at $2^Q$ addresses, where $Q \geq 1$. Each data word may hold P data bits, $P \geq 1$, which are provided on P respective bit output lines. Hence, at a high level of abstraction, a ROM stores a dataset and implements a $2^Q \times P$ look-up table with this dataset, in which the input value is provided on the Q address lines, and the P-bit data word output result is provided on the P bit output lines. By way of example, the following $2^4 \times 4$ dataset is considered:

TABLE 1

| Address | Data word | | | |
|---|---|---|---|---|
| (A3, A2, A1, A0) | B0 | B1 | B2 | B3 |
| 0000 (0) | 0 | 0 | 1 | 1 |
| 0001 (1) | 1 | 0 | 0 | 1 |
| 0010 (2) | 1 | 1 | 1 | 1 |
| 0011 (3) | 1 | 0 | 1 | 1 |
| 0100 (4) | 0 | 0 | 1 | 1 |
| 0101 (5) | 0 | 1 | 0 | 1 |
| 0110 (6) | 1 | 1 | 1 | 1 |
| 0111 (7) | 1 | 1 | 0 | 1 |
| 1000 (8) | 0 | 0 | 1 | 1 |

TABLE 1-continued

| Address | Data word | | | |
|---|---|---|---|---|
| (A3, A2, A1, A0) | B0 | B1 | B2 | B3 |
| 1001 (9) | 1 | 0 | 0 | 1 |
| 1010 (10) | 0 | 0 | 0 | 0 |
| 1011 (11) | 0 | 0 | 0 | 0 |
| 1100 (12) | 0 | 0 | 1 | 1 |
| 1101 (13) | 1 | 0 | 1 | 1 |
| 1110 (14) | 1 | 0 | 0 | 1 |
| 1111 (15) | 1 | 1 | 0 | 1 |

Four address input bits, A0, A1, A2 and A3, provide sixteen addresses, 0 to 15, each of which stores a data word of four bits, B0, B1, B2 and B3. Although specific reference in the following is drawn to a 16×4 dataset, the principles are applicable to any generalized $2^Q \times P$ dataset, where Q is the number of address bits, and P is the number of bits in the data word.

A prior art design for a ROM 10 that implements the dataset of Table 1 is shown in FIG. 1. The prior art design 10 provides a four-bit output data word in response to receiving a four-bit input address. The ROM 10 comprises four bit lines B0, B1, B2 and B3 tied to ground via pull-down resistors 14, and sixteen word lines L0 to L15 connected to an address decoder 12. The word lines L0-L15 are normally held low by the address decoder 12. The decoder 12 is a Q to $2^Q$ decoder. In the specific example, the decoder 12 accepts as input four address lines A0, A1, A2 and A3, and based upon this input selects, or asserts, one of the $2^4$ word lines L0-L15. Since the ROM 10 uses true logic, when a word line L0-L15 is asserted, that word line L0-L15 goes high. The decoder 12 creates a one-to-one correspondence between input values provided by address lines A0-A3 and selected word lines L0-L15, wherein when an address "x" is placed upon address lines A0-A3, the decoder 12 asserts, or raises, word line Lx. For example, if the address inputs (A3, A2, A1, A0) are (0, 0, 0, 0), then the decoder 12 will assert word line L0; all other word lines L1-L15 are not asserted, and so remain low. Similarly, if the address inputs (A3, A2, A1, A0) are (1, 1, 1, 1), then the decoder 12 will assert word line L15, and all other word lines L0-L14 are not asserted. In the following, it is assumed that A3 is the high order address bit, and that A0 is the low order address bit.

Because each output bit line B0-B3 is tied to ground, the bit lines B0-B3 are normally in a logical zero state. By utilizing any suitable connecting device 16 to selectively electrically connect each output bit B0-B3 to zero or more word lines L0-L15, it is possible to implement the dataset of Table 1. By electrically connecting an output bit line B0-B3 to a word line L0-L15, the normally-low output bit line B0-B3 will go high when the word line L0-L15 is asserted. Each connecting device 16 may therefore represent a logical one for the corresponding output bit line B0-B3 at a corresponding value of the input address provided by address lines A0-A3.

For the sake of simplicity, the connecting device 16 of FIG. 1 is shown as a diode 16. One of skill in the art will readily recognize that this diode 16 may, in fact, be replaced by a transistor. Hence, one way to implement the logic array 18 is by using MOS transistors for the connecting devices 16, rather than diodes. It should be noted that when diodes are used as connecting devices 16, the bit lines B0-B3 are normally held low during the read operation, and a diode is typically electrically connected when the associated bit is supposed to be '1'. However, when MOS transistors are used, the bit lines B0-B3 are charged during the read cycle, and thus are normally held high instead of low. A MOS transistor is therefore used as the connecting device 16 for all those bits where the output is supposed to be '0'. But for this difference, the remainder of the logic and following discussion holds for both diode and transistor based configurations. Such minor variations in the type of logic used for the logic array 18 are well within the means of one having ordinary skill in the art, and in the following, for the sake of simplicity, only diodes are shown. One of reasonable skill in the art will also readily note that the ROM 10 can also be configured as a 2-D structure, with both column and row decoders. Such a 2-D structure is simply a slightly more complex generalization of the structure shown in FIG. 1, and is also known in the art.

Because ROM is such a ubiquitous component, it would be highly beneficial if a method could be found to reduce the footprint of the ROM, and thereby free up substrate real estate for other circuit components. In particular, since the logic array 18 that encodes the dataset occupies a relatively large footprint, it would be particularly beneficial if the size of the logic array 18 could be reduced.

SUMMARY OF THE INVENTION

It is an objective of the instant invention to reduce the footprint of a read-only memory (ROM) by tailoring the logic of the ROM to the particular dataset the ROM is to encode. In one aspect, a ROM device includes Q input address lines for supplying a first address, P output bit lines for supplying a P-bit data word according to the first address, and N memory cells $C_1$ to $C_N$, where N>1. Each memory cell $C_i$ comprises $W_i$ word lines respectively electrically coupled to $B_i$ bit lines according to a dataset to be stored within the ROM, in which $1<B_i<P$. Each memory cell $C_i$ also includes a decoder $D_i$ coupled to the Q input lines, which asserts one of the $W_i$ word lines based upon the input first address. The P-bit data word may be obtained from the bit lines of all the memory cells ($C_1$ to $C_N$). This P-bit data word may be used to provide the final output of the ROM. In certain embodiment, each memory cell $C_i$ has fewer than $2^Q$ word lines. In a specific embodiment, each memory cell $C_i$ has no more than 2 to the power of $B_i$ word lines, where $B_i$ is the respective number of bit lines in the memory cell $C_i$. In other embodiments, the total number of bit lines in all of the memory cells $C_i$ equals P, and the bit lines of the memory cells provide the output data word of the ROM. In other embodiments, the bit lines feed into a selector that selects a portion of the bit lines as the output of the ROM based upon an input second address.

In another aspect, a method for designing a ROM that stores a dataset that may be represented as an M×P table is provided. The dataset is partitioned into N sub-datasets capable of respectively being represented by tables $T_1$ to $T_N$, wherein N>1, and for every i from 1 to N, each table $T_i$ is of the form M×$B_i$, with each $B_i$ being less than P. At least one of the N sub-datasets represented by a table $T_r$ is at least partially row collapsed so that at least a first redundant entry in the table $T_r$ is removed and an address of the removed entry is mapped to a second entry. N logic arrays $L_1$ to $L_N$ are then provided that respectively encode the N sub-datasets using $W_1$ to $W_N$ word lines, respectively, and $B_1$ to $B_N$ bit lines, respectively. N decoders $D_1$ to $D_N$ are provided that respectively drive the N logic arrays $L_1$ to $L_N$ according to an input address and any respective mapping information from at least partially row collapsing the respective sub-dataset. In particular, a decoder $D_r$ for a logic array $L_r$ that encodes the at least partially row collapsed sub-dataset represented by the table $T_r$ maps the address of the removed entry to a word line corresponding to an address of the second entry. The output of the bit lines may then be used to provide the output of the ROM. In some embodiments, the method further includes fully row-collapsing each of the N sub-datasets, and for each logic array $L_i$, the corresponding number of word lines $W_i$ within the logic array $L_i$ is no greater than 2 to the power of the number of bit lines $B_i$.

DETAILED DESCRIPTION

Figure 1:
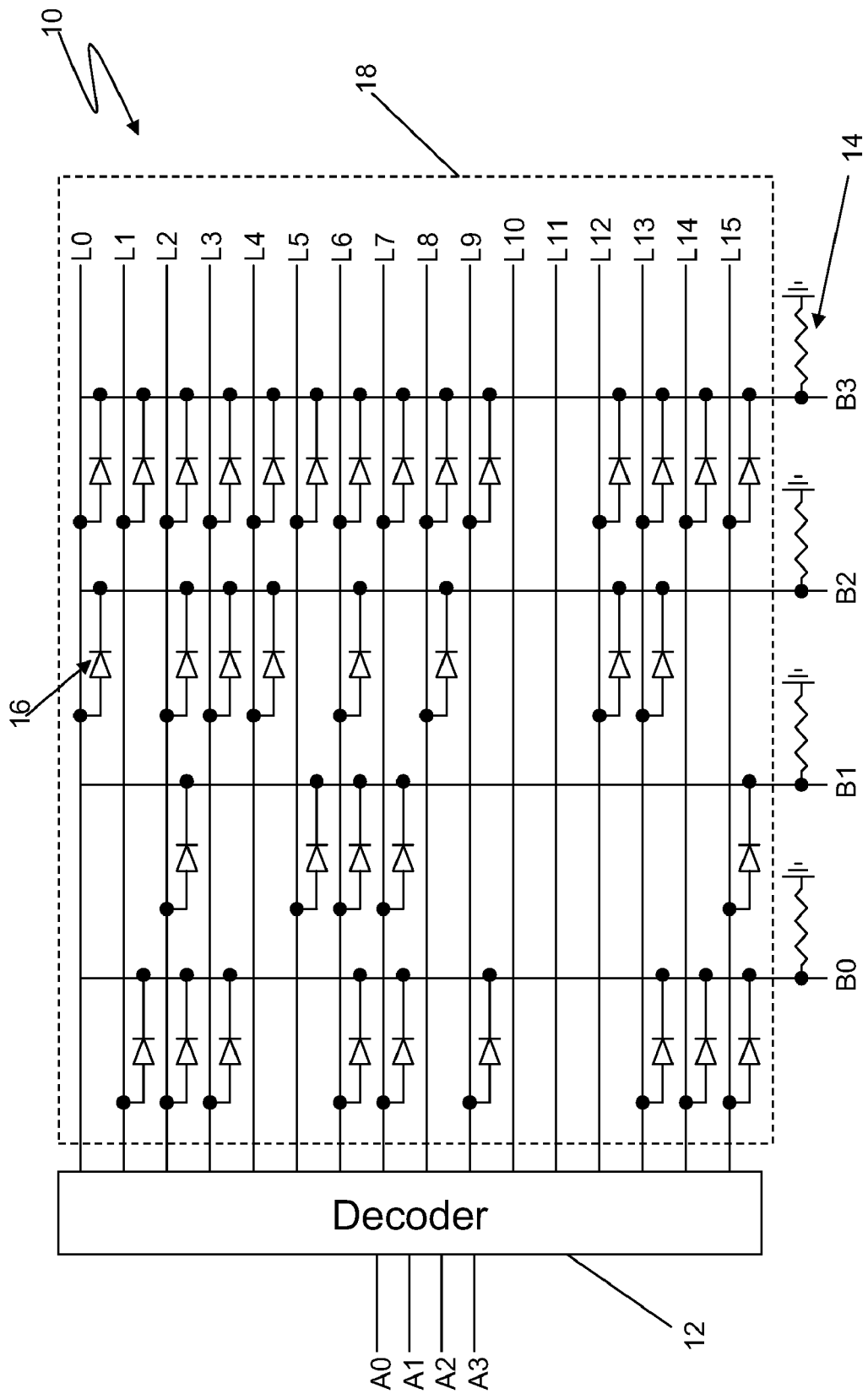
FIG. 1 is a circuit diagram of a prior art ROM design.

For purposes of the following description, when a line is "asserted," a line is driven into a particular logical state to indicate the occurrence of a certain event or value, or to cause a certain event or value to occur. A line may be asserted high (true logic) or low (false logic). As with the design of most digital logic components, the type of logic used, true or false, is purely a design choice. Hence, in the following, if true logic is used by way of example, it should be clear that with minor modifications false logic could equivalently be used. Such permutations in logic are common for those having ordinary skill in the art of digital electronics, and do not require undue experimentation.

The term "map" is broadly meant as an operation which converts a value to another value, such as y=f(x). The mapping function f(x) may map a set of numbers into a larger space, an equally-sized space, or a smaller space. With respect to a digital component, a digital component may map a value provided on an input into another value provided on one or more outputs. With particular respect to a decoder, a decoder accepts as input an N-bit value, and maps that N-bit value by asserting one of X output lines, as known in the art. A decoder may thus be used to map an input value to an output value or line.

Additionally, for purposes of the following, when a word line is said to "store" or "encode" a data word, it is to be understood that such "storing" or "encoding" may be manifested by the electrical connections established between the word line and one or more bit lines.

The instant invention methods, and related ROM designs, seek to improve the layout of a ROM by first analyzing the dataset that the ROM is to store, and then tailoring the design of the ROM to the dataset so as to reduce the number of devices in the ROM. By way of continuing example, reference is again drawn to the dataset of Table 1. A first aspect of the invention begins by noting identical data words in the dataset. If two or more addresses contain the same data word, then the redundant rows in the table corresponding to these entries may be removed, and the addresses of these removed entries may be mapped to the address of the single entry that is not removed. This is termed row collapsing the table or dataset. In the following, when it is stated that a table is row collapsed, it should be understood that the underlying dataset that the table represents is also row collapsed.

In Table 1, addresses zero, four, eight and twelve all have the same data word, (B0, B1, B2, B3)=(0, 0, 1, 1). The rows for any three of these four entries may be considered redundant, such as the entries for addresses four, eight and twelve. The rows for addresses four, eight and twelve may thus be row collapsed. The redundant entries for addresses four, eight and twelve are removed from the table and are mapped to the address of the remaining entry, address zero. Hence, a single row will exist in the newly row collapsed table or dataset, in which the data word is (B0, B1, B2, B3)=(0, 0, 1, 1), and the corresponding address is zero, but which further includes the mapping information containing the three addresses four, eight and twelve. In short, the row collapsed table has a single entry with multiple addresses.

With respect to Table 1, a similar procedure may be performed for other redundant entries. While the table has some remaining redundant entries and others that contain mapping information, the table may be considered partially row collapsed. When all redundant entries have been row collapsed, the result is a fully row collapsed table that contains no rows that have identical data word entries. With respect to Table 1, the fully row collapsed table is presented below:

TABLE 2

| Address | Data word | | | |
|---|---|---|---|---|
| | B0 | B1 | B2 | B3 |
| 0, 4, 8, 12 | 0 | 0 | 1 | 1 |
| 1, 9, 14 | 1 | 0 | 0 | 1 |
| 2, 6 | 1 | 1 | 1 | 1 |
| 3, 13 | 1 | 0 | 1 | 1 |
| 5 | 0 | 1 | 0 | 1 |
| 7, 15 | 1 | 1 | 0 | 1 |
| 10, 11 | 0 | 0 | 0 | 0 |

As can be seen from Table 2 above, more than half of the rows in Table 1 have been collapsed, yielding Table 2 with but seven rows. Each row of Table 2 holds a unique data word (B0, B1, B2, B3). The embodiment invention method proceeds by designing an improved ROM based upon the row-collapsed table, which, like Table 2 above, may ideally have no repetitive data word entries. That is, it is not necessary that the table or dataset be fully row-collapsed, but it may be desirable to fully row-collapse. The improved ROM has a structure similar to the prior art ROM design 10, but has a modified decoder, and a reduced number of word lines. In particular, the improved ROM may have as many word lines as there are rows in the row collapsed table; the row collapsed table may have only unique data word entries (if it is fully row-collapsed), or may have one or more redundant data word entries. In a specific embodiment, the dataset is fully row-collapsed, so that each word line stores a unique data word value that no other word line in the ROM stores. In particular, because a data word of bit size P has but $2^P$ unique data word values, in these embodiments, the ROM will have no more than $2^P$ word lines in the logic array that encodes the fully row collapsed data set. Because there may be more input addresses than word lines, the modified decoder may thus cause at least two input addresses to map to the same word line. That is, in certain embodiments, the modified decoder may be a Q to X decoder, where X is greater than one and less than $2^Q$, and each of $2^Q$ possible input address values maps to one and only one of the X word lines output by the decoder. The mapping function may be constructed so that a word line stores the data word for the redundant address value mapped to that word line.

Figure 2:
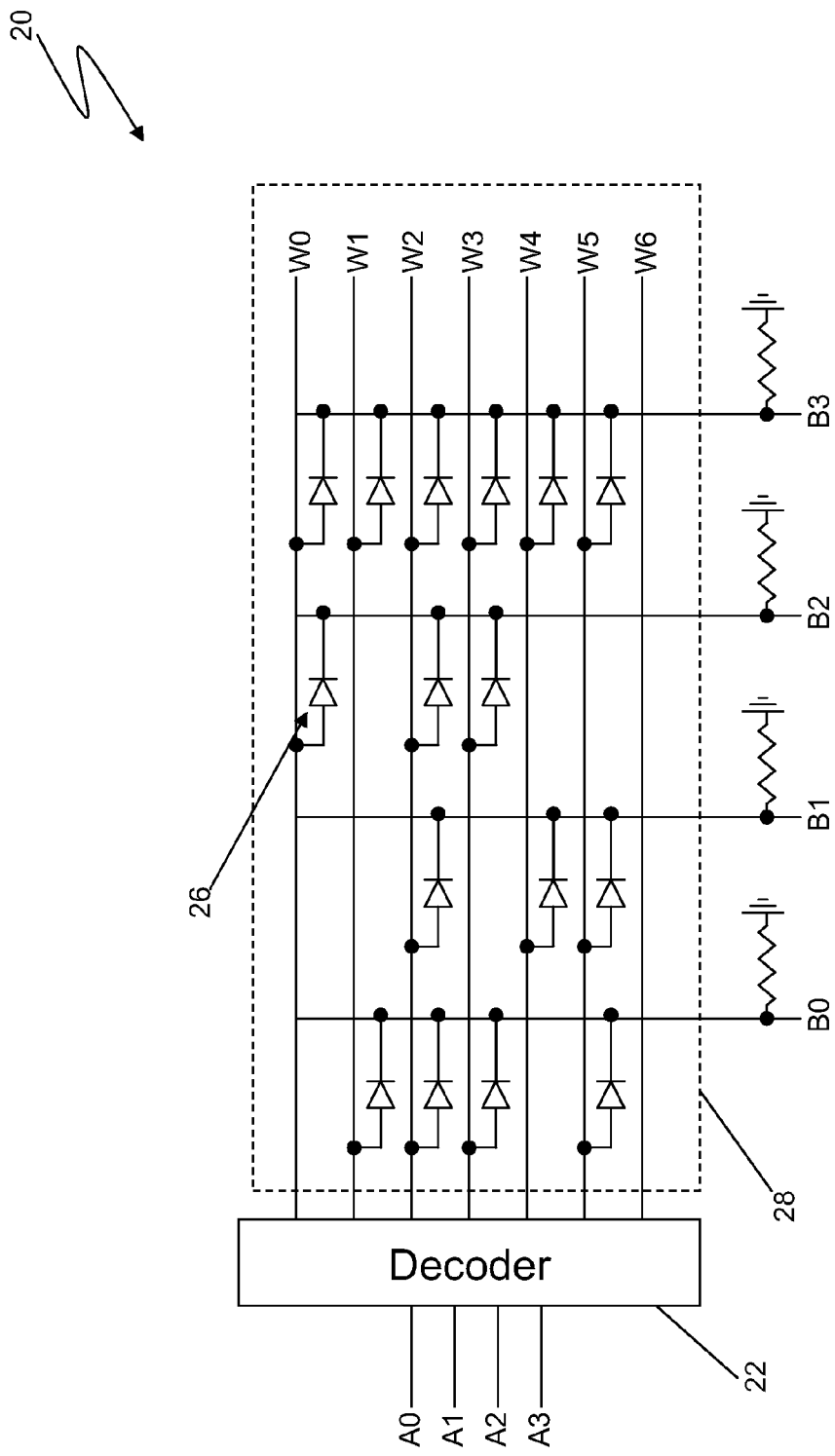
FIG. 2 is a circuit diagram of a first embodiment improved ROM.

A first embodiment improved ROM design 20 is shown in FIG. 2, which implements the fully row collapsed dataset of Table 2. The ROM 20 includes a logic array 28 that has a plurality of word lines W0-W6 that respectively correspond to the rows in Table 2, and a plurality of bit lines B0-B3 that respectively correspond to the columns of Table 2. The bit lines B0-B3 are electrically connected to the word lines W0-W6 according to the dataset of Table 2. Because Table 2 is fully row collapsed, each word line W0-W6 encodes, or stores, a uniquely-valued data word (B0, B1, B2, B3), which are respectively (0, 0, 1, 1), (1, 0, 0, 1), (1, 1, 1, 1), (1, 0, 1, 1), (0, 1, 0, 1), (1, 1, 0, 1) and (0, 0, 0, 0). The design of the ROM 20 appears quite similar to that of the initial design 10, but because the ROM 20 has fewer word lines, the ROM 20 may occupy a smaller foot-print on the substrate.

A decoder 22 implements the mapping information carried within Table 2, asserting word line W0 when the address on address lines A0-A3 is zero, four, eight or twelve; asserting word line W1 when the address is one, nine or fourteen, etc. Decoder 22 is thus a Q to X decoder, where X is less than $2^Q$; specifically, decoder 22 is a 4 to 7 decoder, as required by Table 2, which maps each of $2^{Q=4}$ possible addresses to one of the X=7 word lines. When an address is mapped to a word line, the presence of that address on the input address lines A0-A3 causes the decoder 22 to assert that word line, as previously explained. Designing the decoder 22 should be routine for one of ordinary skill in the art. For example, simply taking the prior art decoder 10 of FIG. 1 and performing a logical OR of L0, L4, L8 and L12 yields the word line W0; a logical OR of word lines L10 and L11 would yield word line W6. Word lines W1-W5 can be provided in a similar manner. However, this is a simplistic approach that may use more gates than are necessary to implement the decoder 22. Known optimization techniques exist to design the decoder 22 with a minimal number of gates or devices. It will be appreciated that if the mapping information within Table 2 is highly redundant, the decoder 22 may have a simpler design than even the prior art decoder 12. For example, if W0 is to be asserted when the address is 0, 4, 8 or 12, then the logic required for decoding will be !A2 & !A3, where "!" indicates a logical NOT operation, and "&" indicates a logical AND operation. This can be implemented using simple logic gates or as a transistor array arranged as in a PLA (Programmable Logic Array).

Besides providing a potentially simpler, and hence smaller, design for the decoder 22, the embodiment ROM 20 uses fewer connecting devices 26 to implement the same dataset, and has fewer word lines. The prior art design 10, for example, requires thirty-six connection devices 16 to implement the dataset of Table 1, and sixteen word lines L0-L15. The embodiment ROM 20, however, requires only sixteen connection devices 26, and seven word lines W0-W6. The logic array 28 of the ROM 20 may thus occupy a considerably reduced footprint on the circuit substrate in comparison to the logic array 18 of the prior art. Additionally, because fewer connection devices 26 are used, the ROM 20 may have both lower power demands, and faster access speeds. By decreasing the number of connecting devices (transistors or diodes), leakage power may be reduced. Since fewer connecting devices are present, capacitance may be reduced, and so rise and fall times will be shorter, making for a faster device.

To provide for further reductions in the footprint of the ROM, the dataset may be partitioned into two or more sub-datasets. Each sub-dataset may have the same address space of the original dataset, but has only a portion of the data bits of the data words. The dataset may be partitioned so as to maximize row collapsing of the sub-datasets, and to minimize the number of logic components used to provide the respective decoders, as discussed below. For example, each sub-dataset may have data words of a bit size that is less than, such as half of or a quarter of, the address bit size. In general terms, an M×P dataset, where M may be $2^Q$, can be partitioned into N sub-datasets of the form $M \times B_1$, $M \times B_2$ ... $M \times B_N$, where $B_1 + B_2 + ... + B_N = P$. This may be thought of as vertically splitting the dataset into N sub-datasets M×$B_i$, which may be respectively represented by tables $T_i$. At least one, and in some embodiments all, of the sub-datasets $T_i$, where i is between 1 and N, is at least partially row collapsed. In certain advantageous embodiments, all of the sub-datasets $T_i$ are fully row collapsed. Memory cells $C_i$ are then respectively provided for the resultant sub-datasets $T_i$, each with its respective decoder $D_i$ and logic array $L_i$. The memory cells $C_i$ are analogous to the first embodiment ROM 20, but each provides only a portion of the total output of the ROM, as provided by its respective sub-dataset $T_i$. Each logic array $L_i$ has as many word lines as there are rows in the respective sub-dataset $T_i$, and as many bit lines as there are columns in the respective sub-dataset $T_i$, encoding the data words of bit size $B_i$ within the sub-dataset $T_i$ by way of appropriate electrical connections between the bit lines and word lines. The word lines of each logic array $L_i$ are driven by the respective decoder $D_i$, which implements the mapping information of the sub-dataset table $T_i$. The output of the bit lines from the memory cells $C_i$ is combined to provide the full P-bit data word output of the ROM. In certain advantageous embodiments, because the datasets $T_i$ are fully row-collapsed, the maximum number of rows in each logic array $L_i$ is $2^{Bi}$. The original structure using a single fully row collapsed dataset would have had a maximum of $2^P$ rows. It is evident that $P=B_1+B_2+ \ldots B_N$. However, in the modified structure, a maximum of $2^{B1}+2^{B2}+ \ldots +2^{BN}$ rows are present, which is less than $2^P$. Better row-collapsing may be possible when vertical splitting of the dataset is performed.

To illustrate the above with a continuing example, the fully row collapsed dataset of Table 2 is considered. Of course, the original dataset as presented by Table 1 does not need to first be row collapsed before being partitioned. A single row collapsing after partitioning will yield the same result as partitioning a row collapsed dataset and then again row collapsing the resultant sub-datasets. However, using the dataset of Table 2 permits the additional benefits of partitioning to be more easily seen. The data set of Table 2 is partitioned into two sub-datasets $T_1$ and $T_2$. Sub-dataset $T_1$ holds data word bits B0 and B1, while sub-dataset $T_2$ holds data word bits B2 and B3. The resultant partitioning is shown in Tables 3 and 4 below:

TABLE 3

Sub-dataset $T_1$

| Address | Data word | |
|---|---|---|
| | B0 | B1 |
| 0, 4, 8, 12 | 0 | 0 |
| 1, 9, 14 | 1 | 0 |
| 2, 6 | 1 | 1 |
| 3, 13 | 1 | 0 |
| 5 | 0 | 1 |
| 7, 15 | 1 | 1 |
| 10, 11 | 0 | 0 |

TABLE 4

Sub-dataset $T_2$

| Address | Data word | |
|---|---|---|
| | B2 | B3 |
| 0, 4, 8, 12 | 1 | 1 |
| 1, 9, 14 | 0 | 1 |

TABLE 4-continued

Sub-dataset $T_2$

| Address | Data word | |
|---|---|---|
| | B2 | B3 |
| 2, 6 | 1 | 1 |
| 3, 13 | 1 | 1 |
| 5 | 0 | 1 |
| 7, 15 | 0 | 1 |
| 10, 11 | 0 | 0 |

The sub-dataset $T_1$ or $T_2$, respective depicted in Table 3 and Table 4, may then be at least partially row collapsed. Alternatively, both of the sub-datasets $T_1$ and $T_2$ may be partially row collapsed. In the particular embodiment discussed in the following, both sub-datasets $T_1$ and $T_2$ are fully row collapsed, yielding the following sub-datasets $T_1'$ and $T_2'$:

TABLE 5

Sub-dataset $T_1'$

| Address | Data word | |
|---|---|---|
| | B0 | B1 |
| 0, 4, 8, 10, 11, 12 | 0 | 0 |
| 5 | 0 | 1 |
| 1, 3, 9, 13, 14 | 1 | 0 |
| 2, 6, 7, 15 | 1 | 1 |

TABLE 6

Sub-dataset $T_2'$

| Address | Data word | |
|---|---|---|
| | B2 | B3 |
| 10, 11 | 0 | 0 |
| 1, 5, 7, 9, 14, 15 | 0 | 1 |
| 0, 2, 3, 4, 6, 8, 12, 13 | 1 | 1 |

As can be seen from the above, each sub-dataset $T_1'$ and $T_2'$ has no more than $2^B$ entries, where B is the bit size of the respective data words within the table. As each table holds words of bit size two, neither Table 5 nor Table 6 will have more than $2^2$, or four, entries. Indeed, the original dataset of Table 1 is so redundant that fully row collapsed sub-dataset $T_2'$ has but three entries, into which are mapped all of the possible $2^4$ or sixteen, possible addresses.

Figure 3:
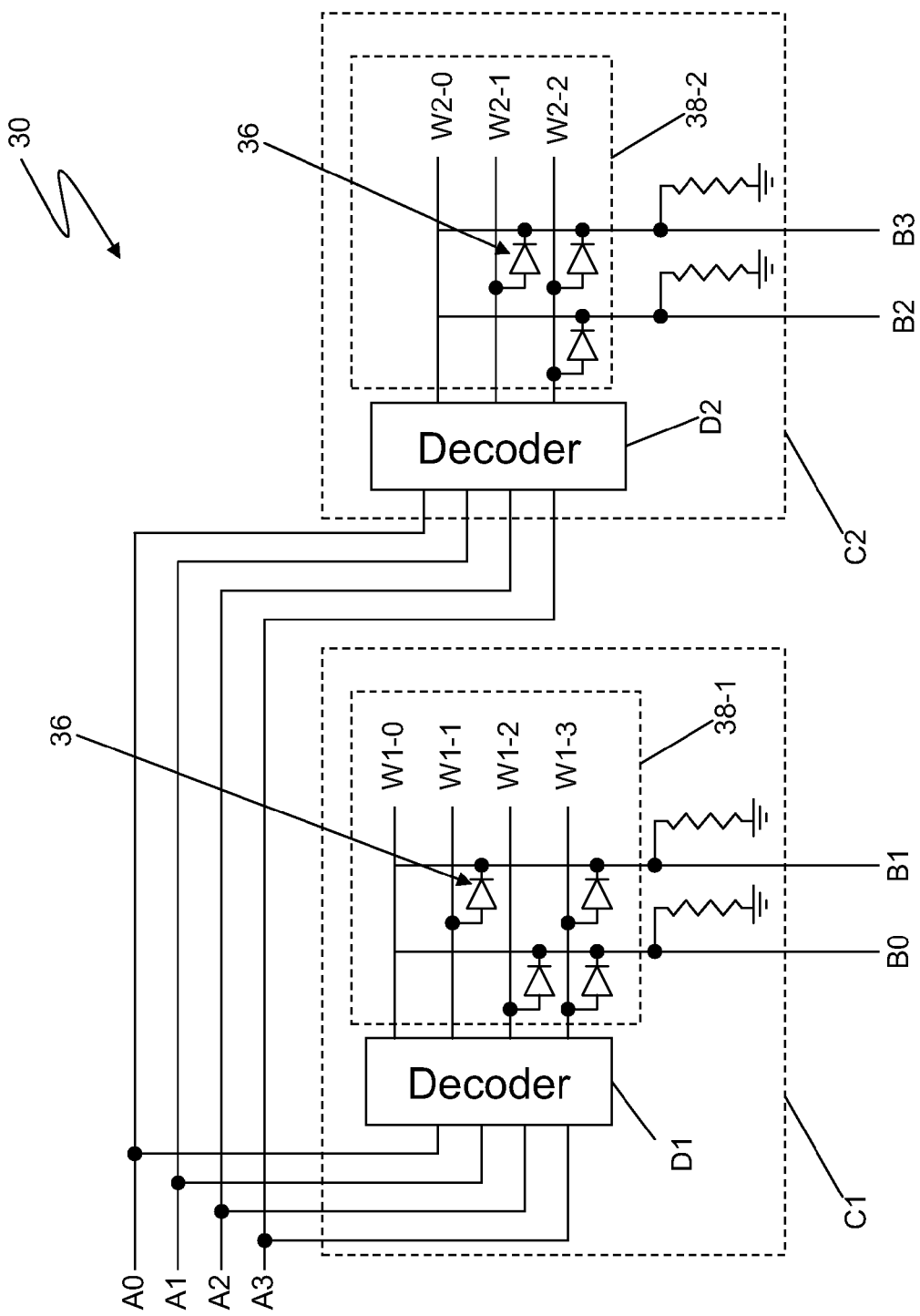
FIG. 3 is a circuit diagram of a second embodiment improved ROM.

A second embodiment improved ROM 30 is depicted in FIG. 3, which implements the data set as presented in Table 1, but uses the fully row-collapsed sub-datasets as presented by Tables 5 and 6. Although in the following, implementations that use fully row collapsed tables are indicated, it should be clear that implementations that use partially row collapsed tables are also possible; that is, improved ROM designs based on sub-dataset tables in which some, but not all, redundant entries have been row collapsed are also possible. Additionally, the use of positive logic in the form of diodes is shown; it should be clear that negative logic, as provided by transistors, could also be used.

The ROM 30 has as many memory cells as there are sub-datasets to be implemented. Each memory cell implements its respective sub-dataset, using its own decoder and logic array. Specifically, the ROM 30 has a first memory cell C1 that implements the sub-dataset of Table 5, and a second memory cell C2 that implements the sub-dataset of Table 6. The first memory cell C1 includes a decoder D1 that implements the mapping information in Table 5, and a logic array 38-1 that implements the data words of the sub-dataset in Table 5. The logic array 38-1 thus has four word lines W1-0 to W1-3, which are electrically connected to two bit lines B0, B1 with connection devices 36 according to the sub-dataset of Table 5. Similarly, the second memory cell C2 includes a decoder D2 that implements the mapping information in Table 6, and a logic array 38-2 that implements the data words of the sub-dataset in Table 6. The logic array 38-2 has three word lines W2-0 to W2-2 electrically connected to two bit lines B2, B3 according to the sub-dataset of Table 6. The bit lines B0-B3 provide the four bits of data output from the ROM 30.

Functionally, the ROM 30 provides the same output B0-B3 for the same input A0-A3 as does the prior art ROM 10, and the first embodiment ROM 20. The ROM 30, however, uses only seven connection devices 36, in contrast to the prior art ROM's use of thirty-six connection devices 16. Further, with the memory cells C1, C2 aligned in a row, the ROM 30 has a height of only four word lines, in contrast to the seven of the first embodiment design 20, and sixteen of the prior art 10. Although the second embodiment design 30 makes use of two decoders D1, D2, based upon the dataset, it is possible that the two decoders D1, D2 together utilize no more substrate real estate on the circuit die than does the prior art decoder 12; this, however, will depend upon the dataset. Indeed, if the dataset is logically quite redundant, suitable selections of data bits B0-B3 may be combined to form memory cells that have relatively simple decoders, providing even more savings in substrate real estate.

The improvement methods and related ROMs of the instant invention have been presented with respect to a highly simple 16×4 ROM for ease of description. One of ordinary skill in the art, however, should recognize that the invention is readily expandable to any M×P ROM; indeed, it is possible that ROMs of greater dimension are more likely to benefit from the instant invention than those of lesser dimensions. In particular, ROMs that have a large address space of relatively small data words are very likely to benefit from the instant invention, as multiple memory cells as provided by the instant invention may provide for less height in the ROM without significantly expanding its width. Also, it will be appreciated that if the pattern for any of two or more bit outputs is absolutely identical, then one can collapse them and have one column but still drive two output lines.

The order of the method steps indicated above may be changed. Additionally, it will be appreciated that there is a functional equivalency between a dataset, the table that represents the dataset, and a memory cell that at least partially encodes the dataset. Hence, the above steps may be performed, for example, not by initially partitioning a table into sub-tables, but rather by partitioning a memory cell into sub-memory cells. Row collapsing can be performed on a dataset, a table, or a memory cell. The method steps may thus be variously performed to achieve the desired objective of a smaller device footprint and reduced component counts.

Figure 4:
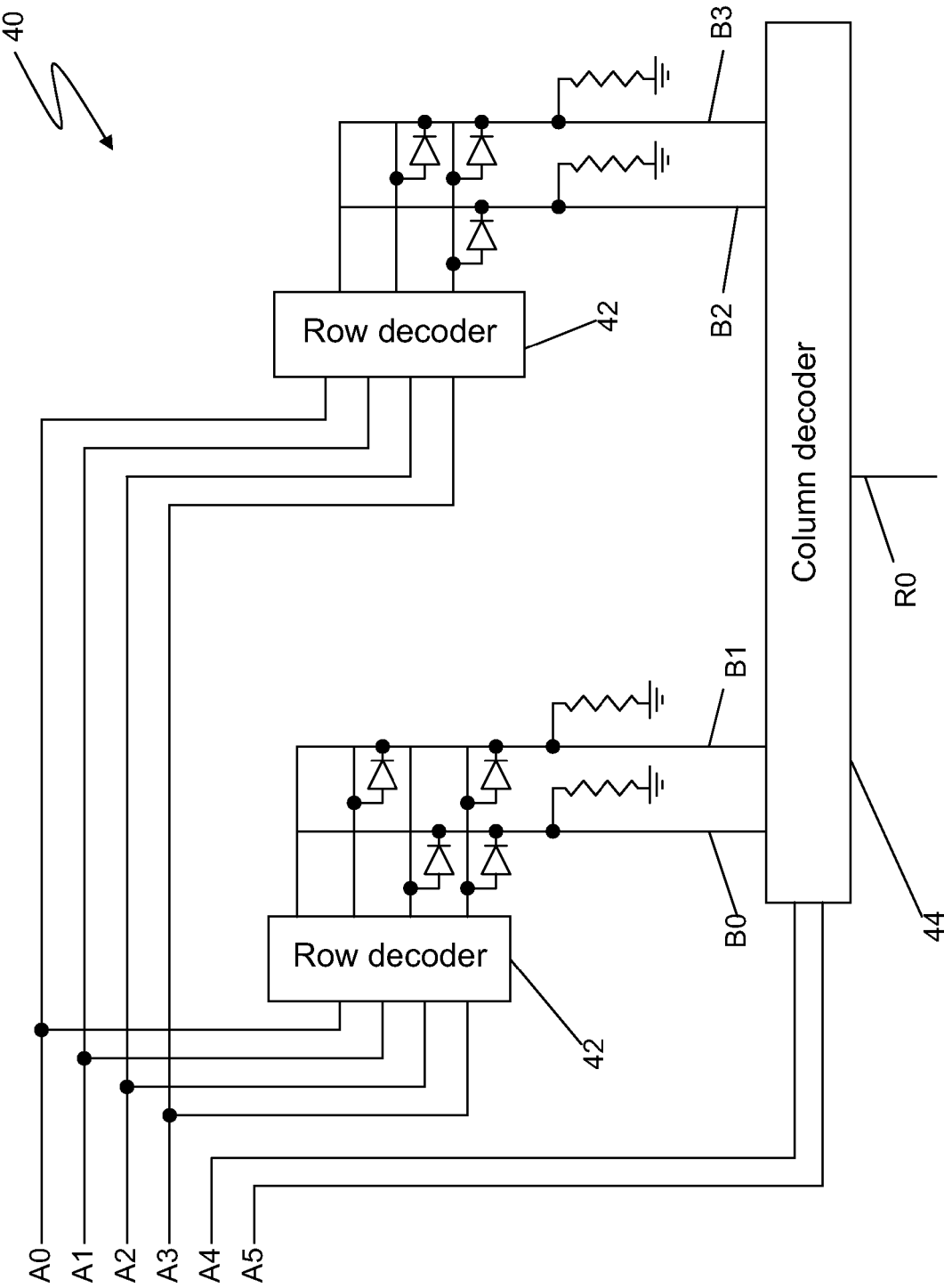
FIG. 4 is a circuit diagram of a third embodiment improved ROM.

For the sake of simplicity only, the above specific embodiments have shown ROM designs that utilize only row decoders for the word lines. It will be appreciated that the instant invention is equally applicable to 2-D ROM designs that utilize both row and column decoders. An example of such a design is depicted in FIG. 4, in which a 2-D ROM design 40 has six address lines A0-A5, which are divided into four row lines A0-A3 that provide a first address, and two column lines A4-A5 that provide a second address. Column decoder 44 selects one of four bit output lines B0-B3 for a result output bit R0 based upon the second address on the column address lines A4 and A5. Row decoders 42 select one of their respective word lines based upon the first address on the row address lines A0-A3. Hence, although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the following claims.

What is claimed is:

1. A read-only memory (ROM) comprising:
   Q input address lines for supplying an address;
   P output bit lines for supplying a P-bit data word according to the first address; and
   N memory cells $C_1$ to $C_N$, where N>1, and each memory cell $C_i$ comprises:
   $W_i$ word lines respectively electrically coupled to $B_i$ bit lines according to a dataset to be stored within the ROM, wherein $1<B_i<P$; and
   a decoder $D_i$ coupled to the Q input lines and adapted to assert one of the $W_i$ word lines according to the first address;
   wherein for at least one of the memory cells $C_i$, the corresponding number of word lines $W_i$ is less than $2^Q$; and
   wherein the P-bit data word is obtained from the bit lines of the memory cells.

2. The ROM of claim 1 wherein for each memory cell $C_i$, the corresponding number of word lines $W_i$ is less than $2^Q$.

3. The ROM of claim 1 wherein for each memory cell $C_i$, the corresponding number of word lines $W_i$ is no greater than 2 to the power of $B_i$.

4. The ROM of claim 3 wherein the summation of $B_i$ for all i from 1 to N equals P.

5. The ROM of claim 4 wherein the bit lines of the memory cells form the P output bit lines.

6. The ROM of claim 4 wherein each decoder $D_i$ maps each of $2^Q$ possible addresses to a corresponding one of the $W_i$ word lines.

7. The ROM of claim 1 further comprising at least one additional input address line for supplying a second address, and a selector coupled to the at least one additional input address line for selecting at least R bits as output of the ROM from the P-bit data word according to the second address, wherein $R \geq 1$.

* * * * *